United States Patent [19]

Ito et al.

[11] Patent Number: 4,742,378

[45] Date of Patent: May 3, 1988

[54] JUNCTION-TYPE SEMICONDUCTOR LIGHT EMITTING DEVICE WITH MESA

[75] Inventors: Hiromasa Ito; Humio Inaba, both of Miyagi, Japan

[73] Assignee: Japan Represented by President of Tohoku University, Sendai, Japan

[21] Appl. No.: 784,890

[22] PCT Filed: Mar. 28, 1985

[86] PCT No.: PCT/JP85/00152

§ 371 Date: Sep. 30, 1985

§ 102(e) Date: Sep. 30, 1985

[87] PCT Pub. No.: WO85/04531

PCT Pub. Date: Oct. 10, 1985

[30] Foreign Application Priority Data

Mar. 28, 1984 [JP] Japan ................................ 59-58159

[51] Int. Cl.$^4$ ............................................ H01L 33/00
[52] U.S. Cl. ..................................... 357/17; 357/56; 357/16; 357/4
[58] Field of Search ..................... 357/17, 16, 4 SL, 56

[56] References Cited

U.S. PATENT DOCUMENTS 4,503,540  3/1985  Nakashima et al. ............... 357/17 X
4,611,222  9/1986  Page ................................. 357/56 X

FOREIGN PATENT DOCUMENTS 0647568  10/1962  Italy ..................................... 357/56
57-152178  9/1982  Japan ................................. 357/4 SL

OTHER PUBLICATIONS

Official Communication, ECOC '84, Tenth Europea Conference on Optical Communication, 3rd-6th Sep. 1984, Stuttgart, pp. 56-57.
Japanese Journal of Applied Physics, vol. 18, No. 12, 1979.
Japanese Journal of Applied Physics, vol. 20, No. 8, Aug. 1981. pp. L563-L566.
Patents Abstracts of Japan, vol. 6, No. 176 (E-130) [1054], 10th Sep. 1982; & JP-A 57 91 574 (Nippon Denki K.K.) 07-06-82.

Primary Examiner—Andrew J. James
Assistant Examiner—William A. Mintel
Attorney, Agent, or Firm—Fleit, Jacobson, Cohn & Price

[57] ABSTRACT

A junction-type semiconductor light emitting device comprising a plate portion, a column formed on one surface of the plate portion and electrodes provided on each of opposite surfaces of the plate portion including the column wall, the column having a pn junction formed therein and extending perpendicular to the plate portion, the plate portion having a pn junction formed therein and extending in parallel with the plate portion, these pn junctions being connected with each other, the current density through the pn junction in the column being larger than that through the pn junction in the plate portion under the application of a predetermined voltage across the electrodes, so as to facilitate the continuous oscillation of this light emitting device at room temperature with the resultant light emission through the column. The light emitting device can be readily arranged in matrix and readily integrated in high degree. Various kinds of sophisticated optical functions can be realized by accumulating a photodetector, a saturable light absorbing layer and the like thereon in the direction of thickness.

28 Claims, 6 Drawing Sheets

JUNCTION-TYPE SEMICONDUCTOR LIGHT EMITTING DEVICE WITH MESA

TECHNICAL FIELD

The present invention relates to semiconductor light emitting devices which are usable as light emitting diodes and laser diodes, and more particularly to a junction-type semiconductor light emitting device whose pn junction is formed perpendicular to a substrate or like plate portion to provide an active region for emitting light in the vertical direction.

BACKGROUND TECHNIQUE

Light emitting devices which radiate light perpendicular to the substrate can be easily coupled to optical fibers and are expected to find various uses as surface emitting light sources. Efforts have therefore been made to develop these devices in the field of research on laser diodes and light emitting diodes, and a wide variety of such devices are in use in recent years.

With the conventional perpendicular radiationtype or surface emitting-type light source device, however, the pn junction is positioned in parallel with the substrate to provide an active region which is usually as small as 2 to 3 μm in thickness. Consequently, a gain which is needed for causing the device of this type to produce laser oscillation of sufficient intensity perpendicular to the substrate. Thus, the device substantially has the fatal drawback that it is difficult to realize continuous oscillation at room temperature as essentially required of useful laser diodes.

Generally speaking, in the field of various systems such as those of optical communication and optical information transference or various optical industrial techniques for manufacturing optical diodes, optical memories and the like, the research and the development of various kinds of semiconductor laser devices, photodiodes and the like as for the source for generating the light regarded as the subject thereof are actively performed. However, in the most of highly efficient semiconductor laser devices which have been conventionally developed, the confinement of carriers and lights is effectively carried out by employing a wafer having double hetetostructure, so that the resultant lights are emitted in the direction parallel with the substrate of the device, as well as the injection of the carriers is effected in the direction of thickness thereof.

On the other hand, the so-called "facial light emitting" device constructed such as the resultant light is emitted in the direction of thickness perpendicular to the device substrate is widely used in the from of light emitting diode. The light emitting device of this kind has been developed as regarded as a light emitting diode having a wide light emitting surface, meanwhile the possibility of realization of a facial light emitting device provided with the function of semiconductor laser.

Figure 1:
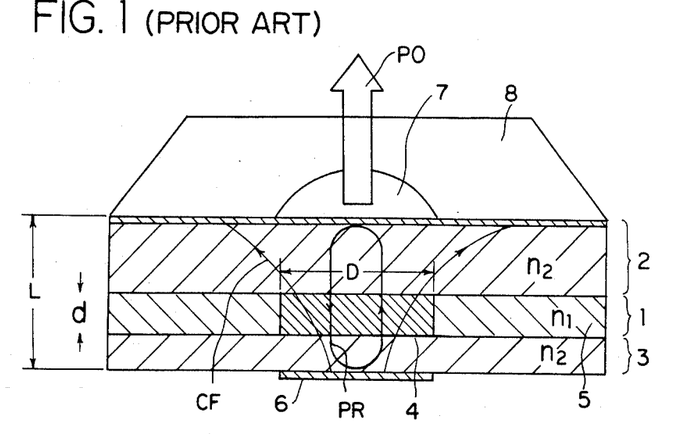
FIG. 1 is a sectional view of an example of the conventional light emitting device as described earlier.

The conventional facial light emitting device of this kind, particularly, the conventional facial light emitting semiconductor laser device is constructed as shown in FIG. 1, that is, as operated as a laser device by basically forming an optical resonator in a manner such as clad layers and a reflector layer are provided on an upper and a lower surfaces of an active region of a facial light emitting type light emitting diode, the latter being sandwiched by the formers.

Concretely speaking, in the crosssectional view of the structure as shown in FIG. 1, an intermediate layer 1 having thickness d is sandwiched by clad layers 2 and 3 consisting of a material having a wide energy gap, so as to form a sandwich structure. Among the clad layers 2 and 3 in this exemplified structure, the thicker clad layer 2 as shown in FIG. 1 is formed as of n-type, meanwhile the other clad layer 3 is formed as of p-type. On an upper surface and a lower surface of this sandwich structure, an annular electrode 8 and a circular electrode 6 are provided, respectively, as shown in FIG. 1, so as to form an active region 4 in the central portion of the intermediate layer 1 usually consisting of an intrinsic material and excited by making a current CF flow therethrough in a bell-bottom shape, this active region 4 only being injected with the carriers from the upper and the lower sides. In addition, the circular electrode 6 provided on the lower surface of the sandwich structure is operated as a reflective mirror, as well as a translucent mirror 7 is provided in a central blank of the annular electrode 8 provided on the upper surface of the sandwich structure, so as to form the optical resonator PR. As a result, the laser oscillation is effected, the output laser light PO resulted therefrom being taken out through the translucent mirror 7.

Accordingly, in the conventional facial light emitting device of this kind, for instance, in the conventional facial light emitting semiconductor laser device, the pn junction, through which the carriers are injected, is formed in the vertical direction, that is, in the direction of thickness of the sandwich structure and hence the thickness of the active region is restricted by the diffusion length of the carriers. As a result, for obtaining a gain for generating the laser oscillation with a sufficient intensity in the conventional facial light emitting semiconductor laser device, an extremely large injection current density is necessitated. So that, the conventional facial light emitting semiconductor laser device essentially has such a fatal defect over the merit of facial light emission that it is difficult to realize the continuous oscilation at room temperature as an unavoidable condition of the semiconductor laser device for practical use.

DISCLOSURE OF THE INVENTION

An object of the present invention is to provide a junction-type semiconductor light emitting device which has a pn junction perpendicular to a plate portion such as a substrate and which is adapted for perpendicular radiation.

Another object of the present invention is to provide a junction-type semiconductor light emitting device which can be fabricated easily by the planar process and which has a large gain effectively perpendicular to its substrate or plate portion.

Another object of the invention is to provide a junction-type semiconductor light emitting device which can be fabricated by facilitated two-dimensional integration and is therefore adapted to have the desired emission pattern for use as a surface emitting light source.

Another object of the invention is to provide a junction-type semiconductor light emitting device which can be coupled to communication optical fibers easily with high efficiency.

Another object of the invention is to provide a junction-type semiconductor light emitting device which includes optical resonating means comprising amplifying means and a reflecting element for optical feedback, and is usable as a laser diode with a low threshold current value required for continuous oscillation at room temperature.

Still another object of the invention is to provide a junction-type semiconductor light emitting device which is useful as a laser diode, light emitting diode, optical amplifier, optical logic device, optical memory element, optical computer, optical audio disk, optical video disk, POS, light-pen or the like and which is suitable as a component of systems for optical measurement, optical communication, optical information processing, etc.

The present invention provides a junction type semiconductor light emitting device comprising a plate portion, a column formed on one surface of the plate portion and electrodes provided on each of opposite surfaces of the plate portion, the column having a tubular pn junction formed therein and extending perpendicular to the plate portion, the plate portion having a pn junction formed therein and extending in parallel with the plate portion, the current density of a circuit through the pn junction in the column being greater than 0.1 times the current density of a circuit through the pn junction in the plate portion, when a predetermined voltage is applied across the electrodes.

BEST MODE FOR CARRYING OUT THE INVENTION

Figure 2A:
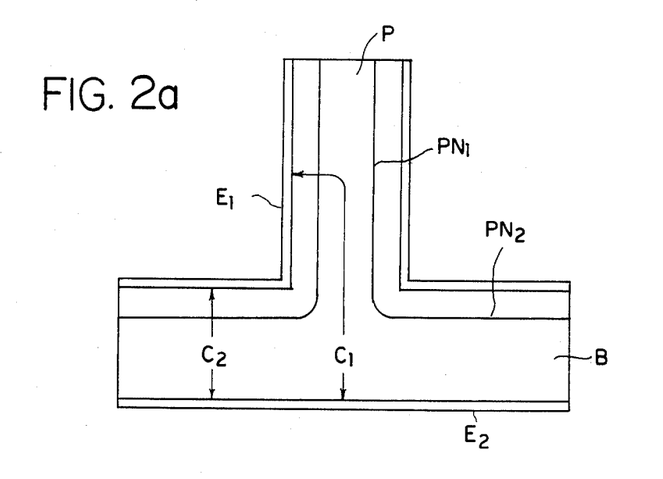
FIGS. 2(a), (b) and (c) are sectional views of light emitting devices for illustrating the basic feature of the present invention.

The basic structure and operation of the present device will be described with reference to FIG. 2(a).

The light emitting device of the present invention comprises a plate portion B, a column P formed on one surface of the plate portion B, an electrode E1 provided on the peripheral side surface of the column P and on the upper surface of the plate portion B, and an electrode E2 provided on the lower surface of the plate portion B. The column P has a tubular pn junction PN1 formed therein and extending perpendicular to the plate portion B. The plate portion B has a pn junction PN2 formed therein and extending in parallel with the plate portion B. The pn junction PN1 may be continuous with the pn junction PN2 as shown in FIG. 2(a), or they may be separate junctions.

In order to produce an emission perpendicular to the plate portion B, the pn junction PN1 only of the two junctions is of use, and the presence of the pn junction PN2 is essentially objectionable. Nevertheless, the presence of the pn junction, if allowed, eliminates all the preparations and ingenuities that would otherwise be needed for the fabrication of the present device so as not to form the pn junction, consequently assuring commercial quantity production of the device at a reduced cost. According to the present invention, however, it is essential to fulfill the following requirement as to a current density difference in order to realize useful perpendicular emission in the presence of the pn junction PN2.

Between the electrodes E1 and E2, there are two circuits, i.e. a circuit C1 through the pn junction PN1 and a circuit C2 through the pn junction PN2. It is now assumed that when a predetermined voltage is applied across these electrodes, the current densities in the circuits C1, C2 are J1, J2, respectively. For the pn junction PN1 to have a light emitting function even in the presence of the pn junction PN2, the following inequality (I) must be satisfied.

$$J1 > 0.1\, J2 \tag{I}$$

If J1 is not greater than 0.1 J2, the pn junction PN1 has a very poor light emitting function, making it difficult to use the device even as a light emitting diode of low output power. For the present device to serve as a light emitting diode of high output or a laser diode adapted for emission at room temperature, it is preferable that the present device has the relation of $$J1 > J2 \tag{II}$$

more preferably, $$J1 > 1.5\, J2 \tag{III}$$

Besides, it is preferable that the total current necessary to operate the present device is lower. Therefore, the current density J1 is preferably less than 100 kA/cm$^2$, more preferably less than 20 kA/cm$^2$, most preferably less than 10 kA/cm$^2$, while the current density J2 is preferably less than 10 kA/cm$^2$, more preferably less than 1 kA/cm$^2$.

Figure 3:
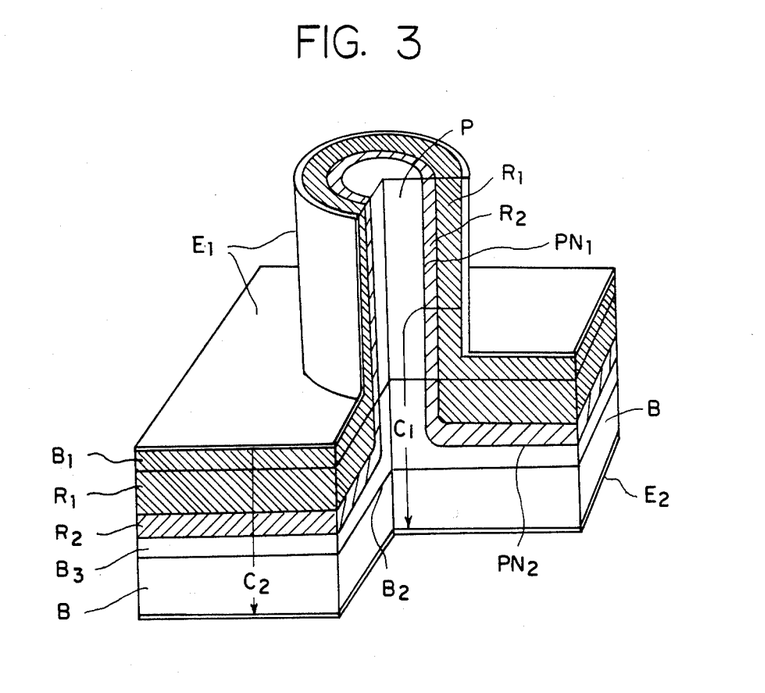
FIGS. 3-4, 5A-5B, 6A-6B, 7A-7B, 8A-8B, 9A-9C, 10A-10B and 11 are perspective views partly in section and showing different embodiments of the invention.

It is possible to make a different between the current density J1 and the current density J2 by various means, for example, by an intermediate barrier layer which is made of a semiconductor having a wide energy gap in the case of the embodiment of FIG. 3. Further with the embodiment of FIG. 4, the plate portion is cut one only locally immediately below the column P to reduce the electric resistance of the circuit C1. According to the present invention, the electrodes E1 and E2 need not always be provided over the entire area of the front surface and rear surface, respectively, of the plate portion B but may be formed only at the required locations. The foregoing relation of the current densities can therefore be realized also by giving consideration to the shape or position of the electrodes E1 and E2. For example, the above relation can be established by providing the electrode E2 over the entire rear surface of the plate portion B and forming the electrode E1 only on the peripheral side surface of the column P or, conversely, by providing the electrode E1 over the peripheral side surface of the column P and over the entire front surface of the plate portion B as shown in FIG. 2(a) and forming the electrode E2 on the rear surface of the plate portion B only locally immediately below the column P or in the vicinity of this location.

According to the present invention, the current densities J1, J2 can be measured, for example, by the following method.

Method of measuring current densities J1, J2:

At the base end of the column P or in the closest proximity thereto, an annular incision is formed in the plate portion B around the column P by reactive ion etching or other suitable method, to a depth sufficient to disconnect the pn junction PN1 from the pn junction PN2 to separate the circuits C1 and C2 from each other. The incision divides the electrode E1 into one electrode portion E11 positioned close to the pn junction PN1 and the other electrode portion E12. A voltage for operating the present device, i.e. a predetermined voltage, for example, in the range of 1 to 10 V, is impressed across the electrode portion E11 and the electrode E2 and also across the electrode portion E12 and the electrode E2, and the values of currents, I1, I2 through the circuits C1, C2 are measured individually. The current density J1 is calculated by dividing the current value I1 by the total area S1 of the pn junction present within the solid cylindrical portion formed by the annular incision. On the other hand, the current density J2 is obtained by dividing the current value I2 by the entire area S2 (or S2/n when n columns P are provided on the plate portion B), other than the sectional area of the above solid cylindrical portion of the pn junction PN2 present within the plate portion B.

According to the present invention, the method of forming the pn junction is not limited particularly. The junction may be formed, for example, by the diffusion of impurities, vapor-phase epitaxy of a p- or n-type semiconductor and an n- or p-type semiconductor (in this case, it is also possible to form a hetero-junction), or other method.

While light emitting diodes in which the pn junction has a length of several microns have linear I-L characteristics, a stimulated emission produces an enhanced spontaneous emission, i.e. so-called amplified spontaneous emission, while the light advances through the active layer if is longer. According to the present invention, the pn junction, contributing to perpendicular emission, can be lengthened by increasing the height of the column P. The column P is preferably at least 2 $\mu$m, more preferably at least 10 $\mu$m, in height. The column can be formed on the surface of a semiconductor wafer, for example, by reactive ion etching. The light emitting device can be fabricated easily with a column having a height of several to hundred of microns.

Figure 2B:
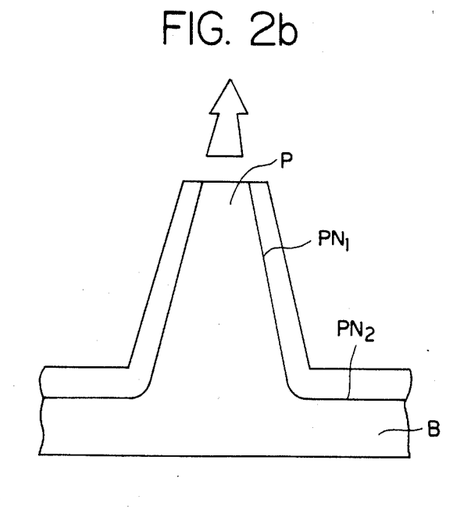
Figure 2C:
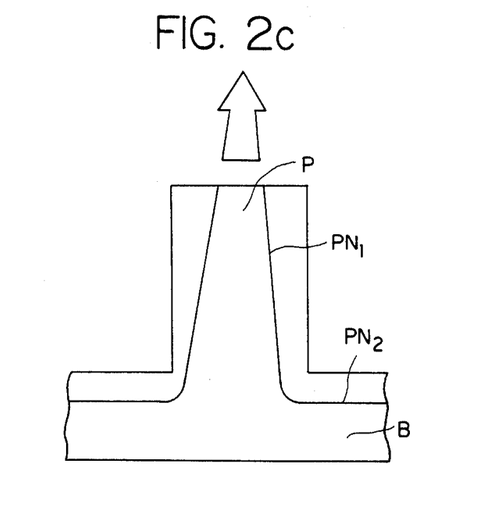

As already described, the pn junction PN1 extending perpendicular to the plate portion B is formed within the column P. According to the present invention, the term "perpendicular" need not be interpreted limitedly as meaning a direction at right angles to the plate portion B but refers also to a direction having an angle of inclination which is slightly larger or smaller than 90 degrees with respect to the plate portion B. As seen in FIG. 2(b) or (c), for example, the whole column P or only the tubular pn junction PN1 formed within the column coaxially therewith may be formed in a frustoconical shape having an increasing diameter toward the base to converge output rays so that the device can be coupled to an optical fiber with greater ease. Conversely, the whole column or the pn junction may be in an inverted frustoconical shape to diffuse the light suitable in conformity with the contemplated use. Furthermore, the column P or the tubular pn junction PN1, which is generally circular in cross section, may have an elliptical, rectangular, square, triangular or some other desired cross section.

Examples of light emitting materials useful for the present device are semiconductor compounds of elements in Groups III to V, such as GaAs, AlGaAs, InP, InGaAsP, InGaP, InAlP, GaAsP, GaN, InAsP, InAsSb, etc., those of elements in Groups II to IV, such as ZnSe, ZnS, ZnO, CdSe, CdTe, etc., and those of elements from Groups IV to VI, such as PbTe, PbSnTe, PbSnSe, etc. These materials are usable making use of the advantage of each.

The material for forming the column P and the plate portion B is optionally selectable insofar as the relation of the foregoing Inequalities (I) to (III) can be fulfilled. Further, according to the embodiments to be described below, the plate portion B has a multi-layer structure including a substrate B3, but the plate portion need not always be of multi-layer structure. For instance, the substrate B3 may be omitted or, conversely, the plate portion B may be in the form of a single layer.

The embodiment shown in FIG. 3 will be described. This embodiment comprises a column P, a plate portion B, an electrode E1 provided over the peripheral side surface of the column P and over the upper surface of the plate portion B, and an electrode E2 formed over the lower surface of the plate portion B. The plate portion B comprises an upper layer B1 formed of the same material as the column P, a barrier layer B2 made of a material having a wider energy gap than the material of the upper layer B1, and a substrate B3. The column P and the plate portion B have a heavily doped p+(or n+) region R1 and a lightly doped p (or n) region R2 which are formed therein by the diffusion of impurities. The other regions of the column P and the plate portion B are not doped and are composed of a material of n-type or p-type in conductivity. In the portion B, the region R2 is present within the barrier layer B2 as shown in the drawing. The column P has in its interior of tubular pn junction PN1 formed coaxially therewith at the interface between the R2 and a region having no impurities diffused therein. Within the barrier layer B2, there is a pn junction PN2 at the interface between the region R2 and a region free from diffused impurities.

Owing to the difference in energy gap between the materials, the pn junction PN1 has a narrower energy gap than the pn junction PN2, with the result that the circuit C1 through the former junction has a greater current density than the circuit C2 through the latter when a predetermined voltage is applied across the electrodes E1 and E2.

Suppose the material forming the column P has an energy gap value $Eg^A$ and the material of the barrier layer B2 has an energy gap value of $Eg^B$. Generally, the relation of Inequality (II) can be satisfied when $$Eg^B > Eg^A \qquad (IV)$$

It is then possible to reduce the current to be injected into the pn junction PN2 while permitting efficient flow of current into the pn junction PN1. More preferably, it is recommended to form the column P and the barrier layer B2 from materials which satisfy Inequality (V), especially Inequality (VI) given below.

$$Eg^B > 1.1\, Eg^A \qquad (V)$$

$$Eg^B > 1.2\, Eg^A \qquad (VI)$$

For example, when GaAs is used for forming the column P and $Al_xGa_{1-x}As$ for the barrier layer B2, the requirements of Inequalitites (IV), (V) and (VI) can be fulfilled if the value x relating to the Al content is greater than zero, at least about 0.115 and at least about 0.23, respectively.

An example of process for fabricating the embodiment of FIG. 3 will be described with reference to the case wherein GaAs-AlGaAs semiconductor materials are used.

First, a heterowafer is prepared by epitaxially forming an n-type $Al_xGa_{1-x}As$ layer B2 over an n-type GaAs substrate B3 and an n-type GaAs layer over the layer B2 for forming a column P and an upper layer B1. In thickness, for example, the layer B2 is 2 to 50 μm, and the uppermost layer is 2 to 200 μm. The uppermost n-type GaAs layer of the heterowafer is then etched, for example, by the reactive ion etching process to form the column P having, for example, a diameter of 5 to 100 μm and a height of 2 to 200 μm. The portion of the uppermost layer remaining after etching away to obtain the column P serves as the upper layer B1. While the top of the column P is covered with a mask layer provided for the etching step, an impurity element, such as Zn, for forming a p-type semiconductor is diffused into the workpiece from the peripheral side surface of the masked column and the surface of the upper layer B1. In this step, the diffusion front toward the substrate B3 is caused to penetrate into the barrier layer B2. Consequently, a pn junction PN1 which is a GaAs homojunction and a pn junction PN2 which is an AlGaAs homojunction are formed.

After the diffusion step, an electrode E1 is formed over the peripheral side surface of the column P and over the surface of the upper layer B1, while an electrode E2 is provided over the surface of the substrate B3 and then the electrode material and the mask layer, which remain on the top of the column P, are removed. In forming the column P by etching, the uppermost layer may be etched to a greater extent to leave no upper layer B1. Furthermore, even the barrier layer B2 may be partially etched away to expose the barrier layer B2 over the surface of the plate portion B. This results in the advantage that the pn junction PN2 can be formed in the barrier layer B2 by a shorter period of impurity diffusion treatment.

The above process provides a junction-type semiconductor light emitting device of the invention which is usable as a light emitting diode. The device is also usable as a laser diode when equipped with an optical resonator which comprises an electrode having the function of a reflecting mirror and serving as the electrode E2 and a semitransparent reflecting mirror provided over the top surface of the column P. With this laser diode, the amplified spontaneous emission from the pn junction undergoes optical feedback to result in laser oscillation, with the result that intense, highly directional light is emitted through the semitransparent reflecting mirror in a direction perpendicular to the plate portion.

Other embodiments will be described below. Throughout the drawings of FIGS. 4 to 13, like parts as in FIG. 3 are referred to by like reference numerals and will now be described unless necessary.

Figure 4:
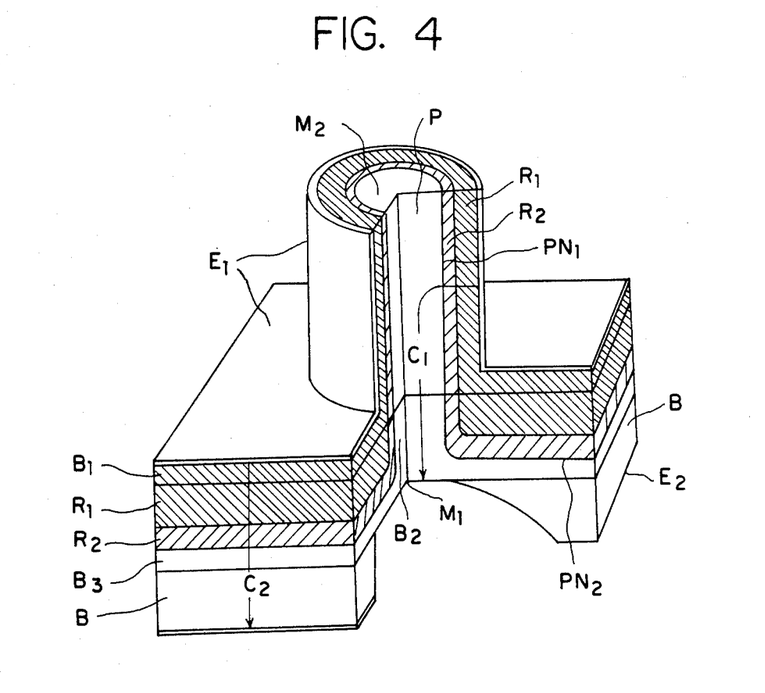

FIG. 4 shows an embodiment useful as a laser diode. The portion of the substrate B3 immediately below the column P is etched away, and the exposed surface of the barrier layer B2 is covered with a reflecting mirror M1. A semitransparent reflecting mirror M2 is provided over the top surface of the column P. Thus, the embodiment has a optical resonator. According to the present embodiment, an electrically insulating material or a semiconductor having a high volume resistivity may be used for the substrate B3, with the reflecting mirror M1 made serviceable also as an electrode. A great current density difference can then be realized between the circuit C1 and the circuit C2 owing to the difference in electric resistance due to the presence or absence of the substrate B3 and, in addition, owing to the foregoing effect afforded by the barrier layer B2.

When a sufficient current density difference is obtained between the circuits C1 and C2 solely by the difference in electric resistance due to the local absence of the substrate B3, the barrier layer need not be formed from a material having a wide energy gap. For example, the portion corresponding to the barrier layer B2 may be made of the same material as the column P.

The present invention includes various modifications such as those described below and obtained by modifying or developing the embodiments shown in FIGS. 3 and 4.

Figure 5A:
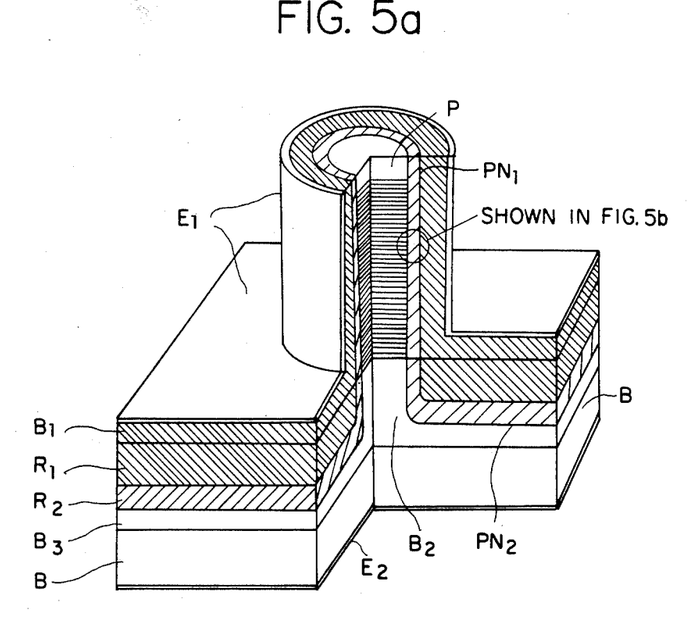
Figure 5B:
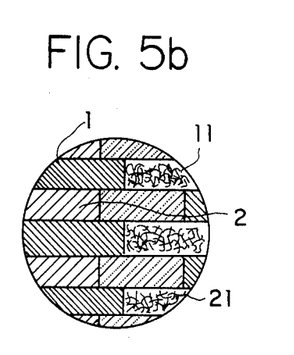

FIG. 5 shows an embodiment wherein the column P comprises layers 1 formed of a semiconductor material having a high refractive index, such as GaAs, and layers 2 made of a semiconductor material having a low refractive index. As shown in the enlarged diagram attached, the layers 1 and 2 are grown and arranged alternatively into a multilayer structure. Each of the layers 1 and 2 has such an optical length that the product of the refractive index by the thickness of the layer is ¼ of the emission wavelength. Accordingly, the column P itself has a distributed feedback laser structure and acts as a reflecting mirror of optical resonator which is required for realizing a laser diode.

A pn junction PN1 can be formed in the column P having the multilayer structure by the foregoing usual method, i.e. by diffusing an impurity element such as Zn. The enlarged diagram attached to FIG. 5 shows a part of the pn junction PN1 of this embodiment in greater detail. The part comprises layers 1, portion 11 formed by diffusing an impurity element into the layers 1, layers 2, and portion 21 formed by diffusing the impurity element into the layers 2.

Figure 6A:
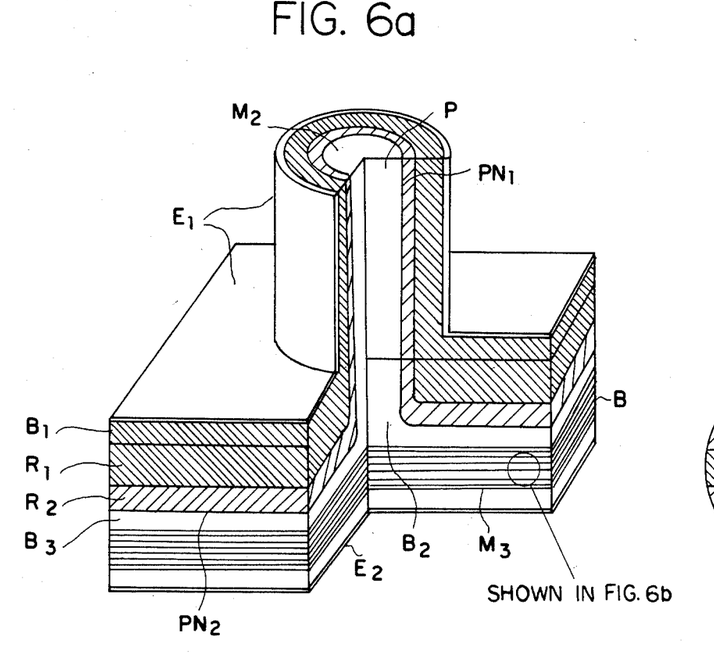
Figure 6B:
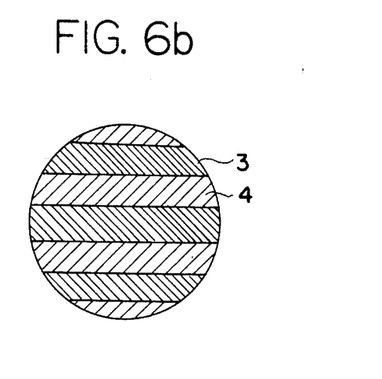

The embodiment of FIG. 6 has a Bragg reflector M3 betwwen the substrate B3 and the barrier layer B2. The reflector M3 acts as a reflecting mirror of optical resonator which is required to realize a laser diode. As seen in the attached enlarged diagram, the reflector M3 comprises layers 3 of a semiconductor material having a high refractive index, such as GaAs, and layers 4 of a semiconductor material having a low refractive index, such as AlGaAs, the layers 3 and 4 being grown and arranged alternately into a multilayer structure of the embodiment shown in FIG. 5, the layers 3 and 4 each have an optical length which is ¼ of the emission wavelength and act to reflect light of specific wavelength. In a modification of the embodiment of FIG. 6, the distributed Bragg reflector M3 may be positioned within or on the upper surface of the barrier layer B2. According to the embodiment of FIG. 6, the reflector M3 and a semitransparent reflecting mirror M2 on the top surface of the column P constitute an optical resonator.

Figure 7A:
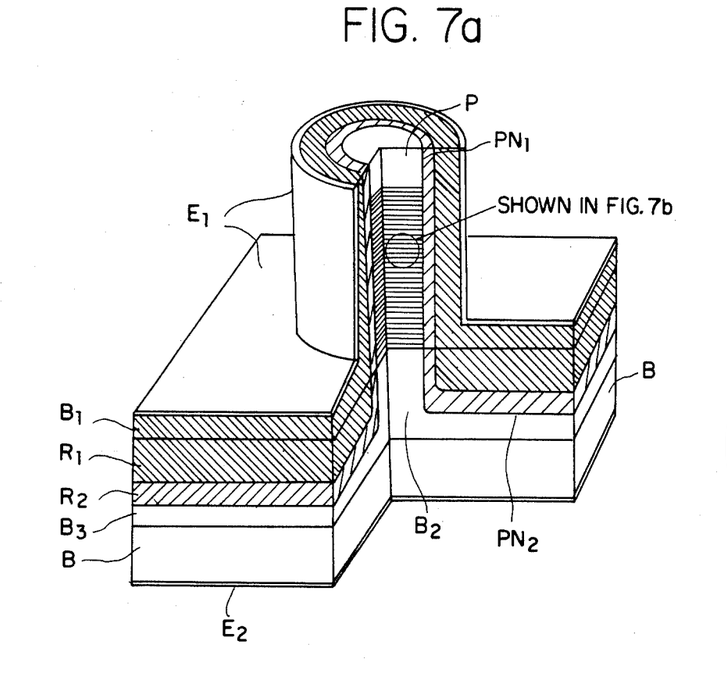
Figure 7B:
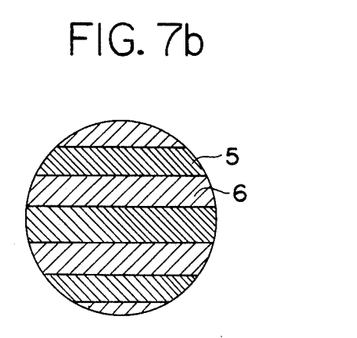

With the embodiment of FIG. 7, the column P comprises layers 5 of a semiconductor material having a narrow energy gap, such as GaAs, and layers 6 of a semiconductor material having a wide energy gap, such as AlGaAs. The enlarged diagram attached shows that the layers 5 and 6 are grown and arranged alternately into a multilayer structure. The layer 5 has a thickness smaller than de Broglie length of electrons, e.g. a thickness of up to 200 to 300 Å. The column P itself therefore has a multiquantum well structure wherein each of many layers 5 with a narrow energy gap is sandwiched between layers 6 of a wide energy gap from above and below. The column P has discrete energy gaps due to the quantum effect of this structure, possessing the advantage that electrons can be confined in the layers 5 and injected into the pn junction PN1 with increased energy. This gives an increased gain to the active region, enabling the device to produce an intensified emission output perpendicular to the base plate. The quantum well structure of the portion containing impurity atoms diffused therethrough assumes the form of mixed crystals to give a heterostructure to the pn junction PN1, which is therefore expected to exhibit the effect of confining light and carriers more efficiently.

The pn junction PN1 of the present embodiment is formed by the aforementioned method, i.e. by diffusing an impurity element such as Zn into the column P having the above multiquantum well structure.

Figures 8A, 8B:
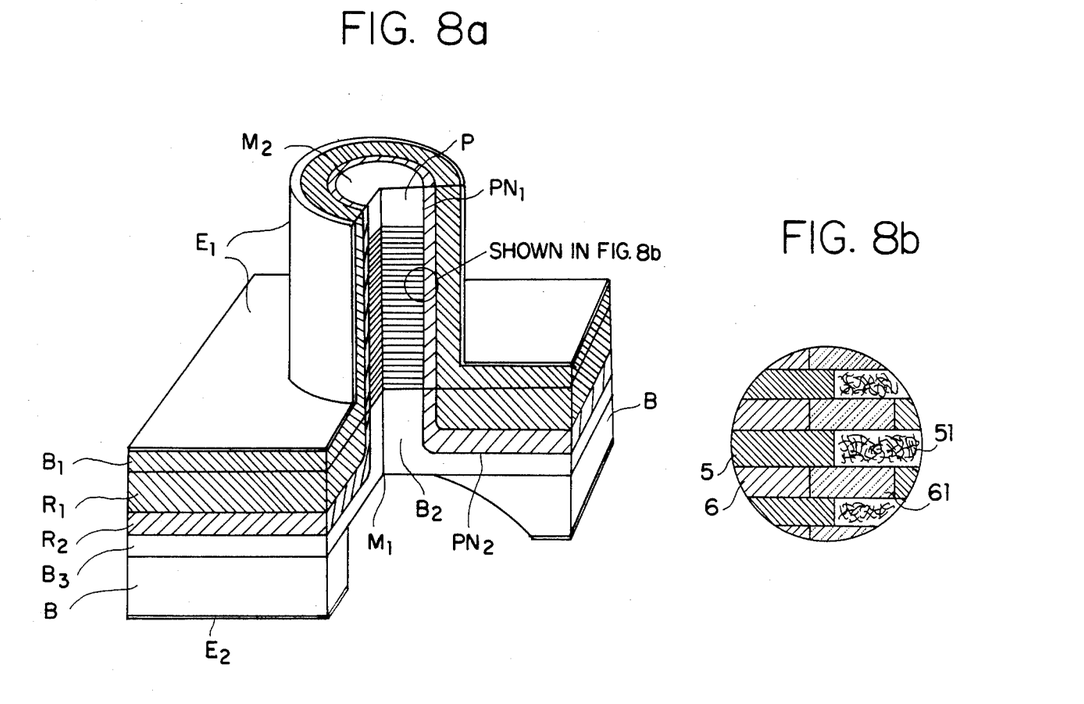

FIG. 8 shows an embodiment which comprises a combination of the embodiment of FIG. 4 and the embodiment of FIG. 7. The column P has a multiquantum well structure, the portion of the substrate B3 immediately below the column P is cut out, and a reflecting mirror M1 is provided over this portion. The enlarged diagram attached to FIG. 8 shows a part of the pn junction PN1 of this embodiment in greater detail. The part comprises layers 5 of narrow energy gap, portion 51 formed by diffusing an impurity element into the layers 5, layers 6 of wide energy gap, and portions 61 formed by diffusing the impurity element into the layers 6.

Figure 9A:
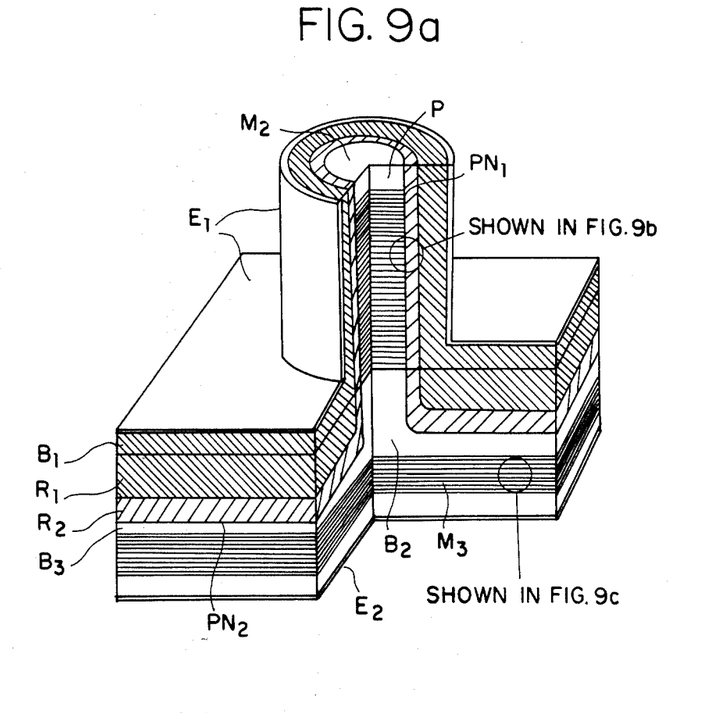
Figure 9B:
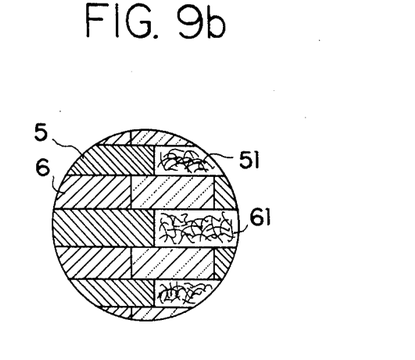
Figure 9C:
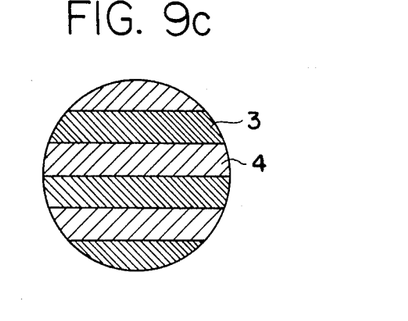

FIG. 9 shows an embodiment which comprises a combination of the embodiment of FIG. 7 and the embodiment of FIG. 6. Accordingly, the column P has a multiquantum well structure, and a distributed Bragg reflector M3 is interposed between the substrate B3 and the barrier layer B2.

Figure 10A:
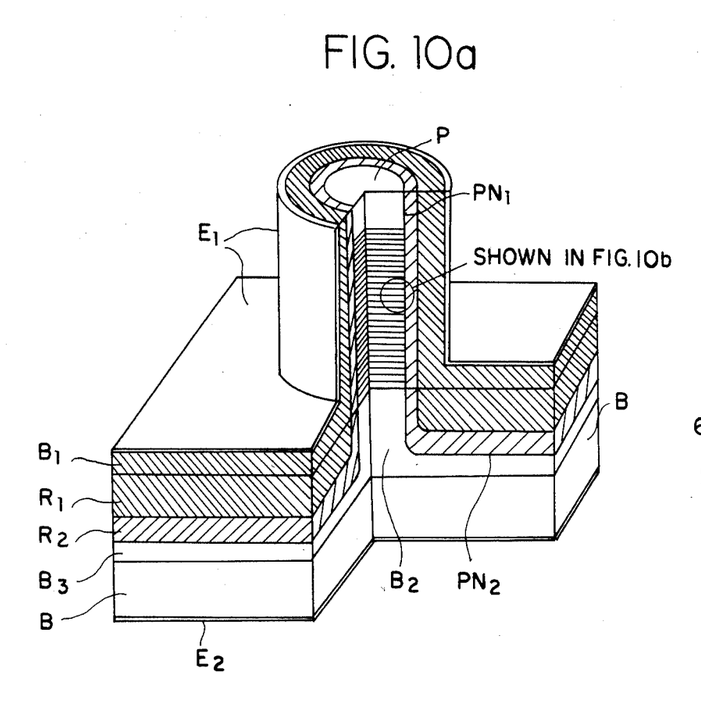
Figure 10B:
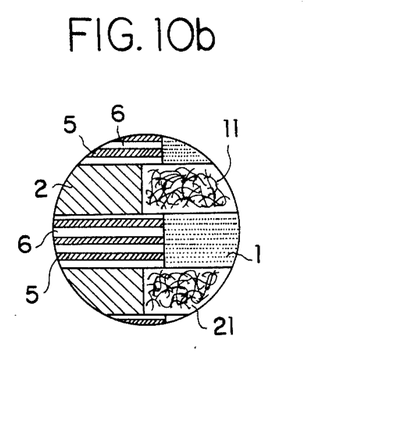

FIG. 10 shows an embodiment which comprises a combination of the embodiment of FIG. 5 and the embodiment of FIG. 7. The column P, in its entirety, has a distributed feedback laser structure comprising two kinds of layers of different refractive indexes, i.e. layers 1 and layers 2 which are arranged alternately. Each layer 1 of higher refractive index has a multiquantum well structure composed of layers 5 and 6 which are arranged alternately. Also, there is portion 11 formed by diffusing an impurity element into the layers 1 and portion 21 formed by diffusing the impurity element into the layers 2. Thus, the embodiment has the feature of a distributed feedback laser and the feature of multiquantum well structure in combination.

Figure 11:
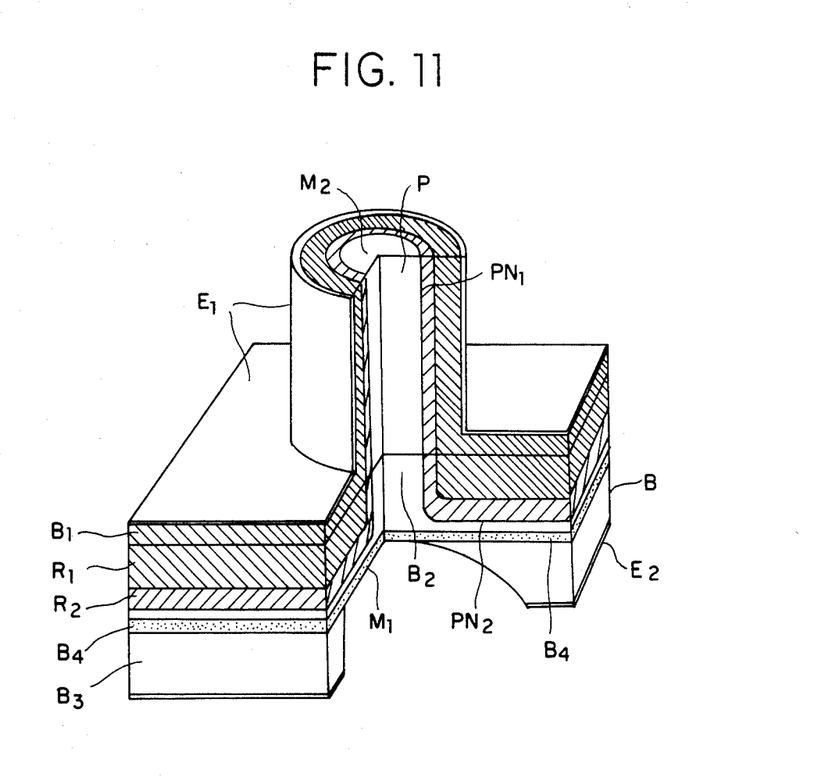

The embodiment of FIG. 11, which is an improvement over the embodiment of FIG. 4, has a saturable absorbing layer B4 between the substrate B3 and the barrier layer B2. The layer B4 assures oscillation control with very high reproducibility. Stated more specifically, it is possible to control the emission of light pulses having an extremely narrow pulse width, for example, of about $10^{-10}$ to about $10^{-13}$ second. Furthermore, this embodiment is expected to achieve improvements in bistability, differential gain, stabilization of oscillation mode, output, noise reduction, S/N ratio, etc.

The saturable absorbing layer may be provided also in the embodiments of FIGS. 6, 8, 9 and 10 and other embodiments.

Figure 12:
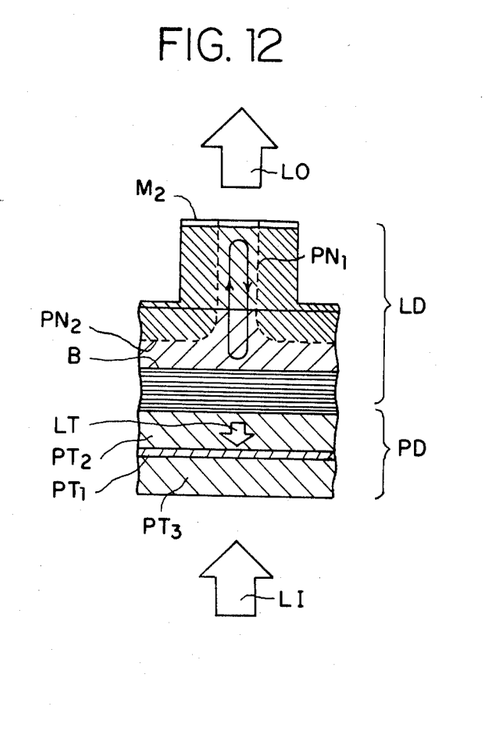
FIG. 12 is a sectional view showing another embodiment of the invention.

Like the embodiment of FIG. 6, the embodiment of FIG. 12 has a semitransparent reflecting mirror M2 provided on the top of the column P and comprising a coating of dielectric material, and a laser diode LD included in the plate portion B and comprising a barrier layer B2 and a distributed Bragg reflector M3. The reflector M3 is composed of GaAs layers and AlGaAs layers arranged alternately into a multilayer structure. The plate portion B further comprises an optical detector PD provided on the rear surface of the laser diode LD. An example of useful optical detector PD is a GaAs phototransistor comprising a base layer PT1, for example, of p-GaAs, a collector layer PT2 for example of n-GaAs formed on the upper side of the base layer, and an emitter layer PT3 for example of n-AlGaAs formed on the lower side of the base layer.

The present embodiment functions as a bistable laser diode based on the principle disclosed in our U.S. patent application Ser. No. 361,816, "Laser Functional Device" or in U.S. patent application Ser. No. 381,842, "Optical Function Semiconductor Device." More specifically, a portion LT of the optical output from the laser diode LD is received by the optical detector PD, which in turn electrically positively feeds back the input to the laser diode LD. Hysteresis and a differential gain is obtained between an optical input LI to the optical detector PD from below and an upward optical output LO from the laser diode LD.

The embodiment shown in FIG. 12 functions as a bistable light emitting diode when incorporating light emitting diode in place of the laser diode LD. Further, if the output of the optical detector PD is electrically negatively fed back to the laser diode LD (or light emitting diode), the emission output of the laser diode LD (or light emitting diode) can be controlled or stabilized as is already known. Optical bistable functional devices having hysteresis or differential gain are available also when an optical component or an electronic component, such as the above phototransistor, is provided on and/or beneath the plate portion B.

Figure 13:
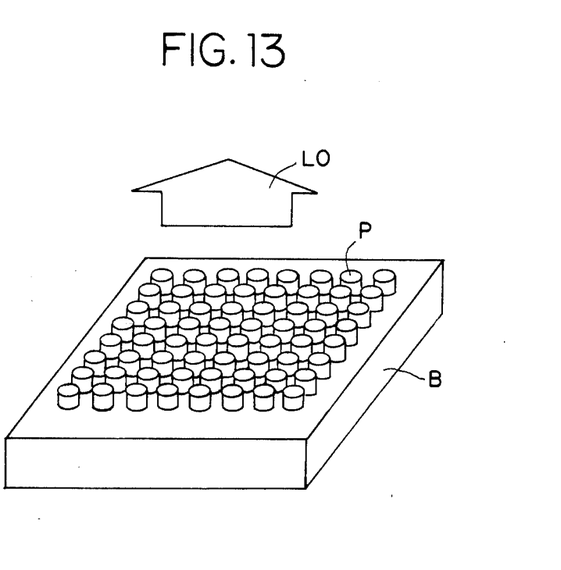
FIG. 13 is a perspective view showing still another embodiment of the invention.

The embodiment shown in FIG. 13 is an example of surface emitting light source having a multiplicity of columns P which are integrated two-dimensionally on the plate portion A. A pn junction PN2 is formed within the plate portion B, while a tubular pn junction PN1 is formed within each column P. An electrode E1 is formed over the upper surface of the plate portion B and over the peripheral side surface of each column P. An electrode E2 is provided over the lower surface of the plate portion B. (The portions PN2, PN1, E1 and E2 are not shown). The electrodes E1 and E2 need not be provided over the entire surface of the plate portion B but may be formed locally where necessary so that the current to be injected into the pn junction PN1 can be increased to the greatest possible extent. Some or all of the individual junction-type light emitting elements, each comprising part of the plate portion B and one column P formed thereon, may have the same structure as any of the embodiments shown in FIGS. 3 to 12, or other structure.

Other embodiments of the present invention comprising two-dimensionally integrated columns include, for example, a surface emitting light source wherein the output and arrangement of columns P are so designed that the emissions from the columns P form the desired pattern, and a device composed of a multiplicity of light emitting elements for transmitting light of optimum wavelength simultaneously to a multiplicity of communication optical fibers which are different or identical in transmission low-wavelength characteristics.

The light emitting devices of the two-dimensionally integrated type, such as the embodiment of FIG. 13 and various modifications mentioned, can be commercially fabricated with ease by combinations of unit procedures (epitaxy, etching, diffusion of impurities, etc.) which are conventional in the art, for example, by the combination of unit procedures including the planar process and already described for fabricating the embodiment of FIG. 3.

As will be apparent from the above description, the junction-type semiconductor light emitting device of the present invention embodies the superiority of surface emitting devices and gives a high emission output with high efficiency based on the principle. Whereas the conventional surface emitting devices including a perpendicular pn junction has limitations on the emission region in the direction of its thickness, the present device is completely free of such limitation. The light emitting device of the present invention wherein the active region has a sufficient length e.g. several to hundreds of microns, in the direction of emission has the outstanding feature that intensified output light is available utilizing the amplification by stimulated emission. By making use of this feature, it is possible to provide laser diodes, super-luminescent diodes, high-output light emitting diodes, etc.

According to the present invention, the column of the device where emission occurs can be prepared with a desired cross sectional form and desired dimensions. When made identical to an optical fiber in cross sectional form and dimensions therefore, the column can be coupled directly to the optical fiber with a low loss and without using any condenser means. Alternatively, with use of optical means such as a microlens or Fresnel lens, or in the case of the convergent light emitting device shown in FIGS. 2(b) and 2(c), the column can be coupled to optical fibers with a greatly improved efficiency. Moreover, the present device itself achieves a remarkably increased convergence efficiency because of its satisfactory spatial coherence characteristics. Thus, the present device has outstanding advantages which are not available with the conventional light emitting devices.

The light emitting diodes, as well as the laser diodes, of the present invention produce good spatial coherence characteristics, are serviceable as light sources of high output and are therefore usable for video disks, printers and POS, and also for a wide variety of applications in technical fields where quantity production is required.

Furthermore with the junction-type laser diode of the invention which has an optical resonator and an elongated active region, it is substantially easy to obtain continuous oscillation at room temperature, because the device has a longer active region than the conventional surface emitting laser diode which encounters extreme difficulties in affording this mode of oscillation since it is adapted for oscillation perpendicular to the substrate. The structure of the present device is amenable to the two-dimensional arrangement of components or a high degree of integration thereof, making it possible to provide various sophisticated light function devices by integrating optical detectors or saturable absorbing layers in the direction of thickness.

What is claimed is:

1. A junction-type semiconductor light emitting device comprising a semiconductor plate portion, a semiconductor column formed on one surface of the plate portion and electrodes provided on each of opposite surfaces of the plate portion, the column having a pn junction formed therein and said column and said pn junction extending perpendicular to the plate portion, the plate portion having a pn junction formed therein and extending parallel to the plate portion, the current density $J1$ of a circuit through the pn junction in the column being at least 0.1 times the current density $J2$ of a circuit through the pn junction in the plate portion when a predetermined voltage is applied across the electrodes.

2. A device as defined in claim 1 wherein the current density $J1$ is greater than the current density $J2$.

3. A device as defined in claim 2 wherein the plate portion comprises a barrier layer made of a semiconductor having a wider energy gap than the semiconductor forming the column, and the pn junction extending parallel to the plate portion is positioned within the barrier layer.

4. A device as defined in claim 3 wherein the pn junctions present within the column and within the plate portion are formed by the diffusion of an impurity element of one of p-type and n-type into said column of type opposite to said impurity element and said portion of type opposite to said impurity element respectively.

5. A device as defined in claim 4 wherein the impurity element is Zn.

6. A device as defined in claim 1 wherein the column is at least 2 $\mu m$ in height.

7. A device as defined in claim 3 wherein reflecting means is provided at each of longitudinally opposite sides of the pn junction within the column to provide optical resonance.

8. A device as defined in claim 7 wherein the column has a distributed feedback laser structure formed of at least two kinds of semiconductor materials having at least a first refractive index and at least a second refractive index lower than said first refractive index, respectively.

9. A device as defined in claim 7 or 8 wherein the column has a multiquantum well arranged alternatively into a multilayer structure.

10. A device as defined in claim 7 wherein the plate portion has a distributed Bragg reflector having alternatively arranged semiconductor material with a first refractive index and a second refractive index lower than said first refractive index forming a multilayer structure.

11. A device as defined in any one of claims 2 to 6 wherein the plate portion has a saturable absorbing layer means for controlling emission of light pulses.

12. A device as defined in claim 1 wherein condenser means is provided on the column to converge light.

13. A device as defined in claim 1 wherein an optical element means for a given. hysteresis is provided on the plate portion.

14. A junction-type semiconductor light emitting device comprising a semiconductor plate portion, a semiconductor column formed on one surface of the plate portion and electrodes provided on each of opposite surfaces of the plate portion, the column having a pn junction formed therein and said column and said pn junction extending perpendicular to the plate portion, the plate portion having a pn junction formed therein and extending parallel to the plate portion, the device having a structure for causing a larger amount of current to be injected into the pn junction within the column than into the pn junction within the plate portion when a predetermined voltage is applied across the electrodes.

15. A device as defined in claim 14 wherein the plate portion comprises a barrier layer made of a semiconductor having a wider energy gap than the semiconductor forming the column, and the pn junction extending parallel to the plate portion is positioned within the barrier layer.

16. A device as defined in claim 14, wherein the pn junctions present within the column and within the plate portion are formed by the diffusion of an impurity element of one of p-type and n-type into said column of type opposite to said impurity and said plate portion of type opposite to said impurity, respectively.

17. A device as defined in claim 16 wherein the impurity element is Zn.

18. A device as defined in claim 14 wherein the column is at least 2 μm is height.

19. A device as defined in claim 14 wherein reflecting means is provided at each of longitudinally opposite sides of the pn junction within the column for optical resonance.

20. A device as defined in claim 14 wherein the column has a distributed feedback laser structure formed of at least two kinds of semiconductor materials having at least a first refractive index and at least a second refractive index lower than said first refractive index, respectively.

21. A device as defined in claim 7 or 14 wherein the column has a multiquantum well arranged alternatively into a multilayer structure.

22. A device as defined in claim 14 wherein the plate portion has a distributed Bragg reflector having alternatively arranged semiconductor material with at least a first refractive index and at least a second refractive index lower than said first refractive index forming a multilayer structure, respectively.

23. A device as defined in claim 14, wherein the plate portion has a saturable absorbing layer means for controlling emission of light pulses.

24. A device as defined in claim 1 wherein an optical element means for a given hysteresis is provided on and beneath the plate portion.

25. A device as defined in claim 1 wherein an optical element means for a given hysteresis is provided beneath the plate portion.

26. A device as defined in claim 1 wherein an electronic element means for a given differential gain is provided on the plate portion.

27. A device as defined in claim 1 wherein an electronic element means for a given differential gain is provided beneath the plate portion.

28. A device as defined in claim 1 wherein an electronic element means for a given differential gain is provided on and beneath the plate portion.

* * * * *